United States Patent
Arakawa et al.

(10) Patent No.: US 9,761,422 B2
(45) Date of Patent: Sep. 12, 2017

(54) MAGNETIC MATERIAL SPUTTERING TARGET AND MANUFACTURING METHOD FOR SAME

(71) Applicant: JX Nippon Mining & Metals Corporation, Tokyo (JP)

(72) Inventors: Atsutoshi Arakawa, Ibaraki (JP); Hideo Takami, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 19 days.

(21) Appl. No.: 14/379,796

(22) PCT Filed: Feb. 15, 2013

(86) PCT No.: PCT/JP2013/053753
§ 371 (c)(1),
(2) Date: Aug. 20, 2014

(87) PCT Pub. No.: WO2013/125469
PCT Pub. Date: Aug. 29, 2013

(65) Prior Publication Data
US 2015/0021175 A1    Jan. 22, 2015

(30) Foreign Application Priority Data
Feb. 22, 2012    (JP) .................. 2012-036562

(51) Int. Cl.
C23C 14/00    (2006.01)
H01J 37/34    (2006.01)
(Continued)

(52) U.S. Cl.
CPC ...... *H01J 37/3429* (2013.01); *C23C 14/3414* (2013.01); *G11B 5/851* (2013.01); *C23C 14/165* (2013.01)

(58) Field of Classification Search
CPC .................................................. C23C 14/085
See application file for complete search history.

(56) References Cited

U.S. PATENT DOCUMENTS 5,409,517 A * 4/1995 Satou ............... C04B 35/58085
75/228
7,638,020 B2 12/2009 Honda
(Continued)

FOREIGN PATENT DOCUMENTS

EP        1008670 A1    6/2000
JP        H10-88333 A    4/1998
(Continued)

*Primary Examiner* — Timon Wanga
(74) *Attorney, Agent, or Firm* — Howson & Howson, LLP

(57) ABSTRACT

A magnetic material sputtering target characterized in that, in a plane for observing the oxide in the target, oxide grains in the target have an average diameter of 1.5 μm or less, and that 60% or more of the oxide grains in the observing plane of the target have a difference between a maximum diameter and a minimum diameter of 0.4 μm or less, where the maximum diameter is a maximum distance between arbitrary two points on the periphery of an oxide grain, and the minimum diameter is a minimum distance between two parallel lines across the oxide grain. A non-magnetic grain dispersion-type magnetic material sputtering target that can inhibit abnormal discharge due to an oxide causing occurrence of particles during sputtering is obtained.

14 Claims, 4 Drawing Sheets

(51) Int. Cl.
*G11B 5/851* (2006.01)
*C23C 14/34* (2006.01)
*C23C 14/16* (2006.01)

(56) References Cited

U.S. PATENT DOCUMENTS

| | | |
|---|---|---|
| 7,909,949 B2 | 3/2011 | Nakamura et al. |
| 8,568,576 B2 | 10/2013 | Sato |
| 8,679,268 B2 | 3/2014 | Ogino et al. |
| 2007/0189916 A1 | 8/2007 | Zhang |
| 2009/0134015 A1 | 5/2009 | Racine et al. |
| 2009/0229976 A1 | 9/2009 | Kato et al. |
| 2009/0242393 A1 | 10/2009 | Satoh |
| 2010/0243435 A1* | 9/2010 | Kato .................. C22C 5/04 204/298.03 |
| 2011/0162971 A1 | 7/2011 | Nakamura et al. |
| 2011/0247930 A1 | 10/2011 | Sato |
| 2011/0284373 A1 | 11/2011 | Sato et al. |
| 2011/0293966 A1* | 12/2011 | Hashimoto ............ G11B 5/851 428/826 |
| 2012/0118734 A1 | 5/2012 | Sato et al. |
| 2012/0241317 A1 | 9/2012 | Ikeda et al. |
| 2012/0273347 A1 | 11/2012 | Koide |
| 2012/0318669 A1 | 12/2012 | Ikeda et al. |
| 2013/0098760 A1 | 4/2013 | Takami et al. |
| 2013/0112555 A1 | 5/2013 | Ogino et al. |
| 2013/0134038 A1 | 5/2013 | Sato et al. |
| 2013/0168240 A1 | 7/2013 | Ogino et al. |
| 2013/0175167 A1 | 7/2013 | Ikeda et al. |
| 2013/0206591 A1 | 8/2013 | Takami et al. |
| 2013/0213802 A1 | 8/2013 | Sato et al. |
| 2013/0220804 A1 | 8/2013 | Arakawa et al. |
| 2013/0248362 A1 | 9/2013 | Ogino et al. |
| 2013/0292245 A1 | 11/2013 | Ikeda et al. |
| 2014/0001038 A1 | 1/2014 | Ogino et al. |

FOREIGN PATENT DOCUMENTS

| | | |
|---|---|---|
| JP | 2001-076329 A | 3/2001 |
| JP | 2005-272946 A | 10/2005 |
| JP | 2006-045587 A | 2/2006 |
| JP | 2008-240011 A | 10/2008 |
| JP | 2009-001860 A | 1/2009 |
| JP | 2011-222086 A | 11/2011 |

* cited by examiner

MAGNETIC MATERIAL SPUTTERING TARGET AND MANUFACTURING METHOD FOR SAME

BACKGROUND

The present invention relates to a magnetic material sputtering target that is used for forming a magnetic thin film for a magnetic recording medium, in particular, a granular film for the magnetic recording medium of a hard disk employing a perpendicular magnetic recording system, and relates to a non-magnetic grain dispersion-type magnetic material sputtering target that can inhibit abnormal discharge due to an oxide causing occurrence of particles during sputtering, and a method of producing the target.

Though various systems are known as sputtering apparatuses, in formation of magnetic recording films, magnetron sputtering apparatuses equipped with DC power sources are widely used because of the high productivity thereof. In magnetron sputtering, a high density of plasma can be concentrated near the front surface of a target by disposing a magnet on the back face of the target and leaking a magnetic flux to the front surface of the target, resulting in an increase in the deposition rate.

Meanwhile, in the development of magnetic materials in the field of magnetic recording represented by hard disk drives, ferromagnetic metals, such as Co, Fe, or Ni-based materials, are used as materials for magnetic thin films that carry out recording. For example, in recording layers of hard disks employing a longitudinal magnetic recording system, Co—Cr based or Co—Cr—Pt based ferromagnetic alloys mainly containing Co have been used.

In addition, in recording layers of hard disks employing a perpendicular magnetic recording system, which has been applied to practical use recently, composite materials composed of Co—Cr—Pt based ferromagnetic alloys mainly containing Co and nonmagnetic inorganic materials are widely used.

Many of magnetic thin films of magnetic recording media such as hard disks are produced by sputtering a magnetic material sputtering target composed of the above-mentioned materials because of its high productivity.

As methods of producing these magnetic material sputtering targets, a melting method and a powder metallurgy method are proposed. The method used for producing a target is chosen depending on the characteristics required for the target, and the sputtering target composed of a ferromagnetic alloy and nonmagnetic inorganic grains, which is used for forming a recording layer of a hard disk of a perpendicular magnetic recording system, is usually produced by the powder metallurgy method. This is because since the inorganic grains are required to be uniformly dispersed in the alloy base material, it is difficult to produce the target by the melting method.

For example, proposed is a method of preparing a sputtering target for a magnetic recording medium by mechanically alloying an alloy powder having an alloy phase produced by rapid solidification and a powder constituting a ceramic phase to uniformly disperse the powder constituting a ceramic phase in the alloy powder, and molding the resulting powder by hot pressing (Patent Document 1).

The target structure in this case appears such that the base links in a soft roe-like (cod roe-like) manner and $SiO_2$ (ceramics) surrounds the base (FIG. 2 of Patent Document 1) or is dispersed in the form of strings (FIG. 3 of Patent Document 1). Though other drawings are unclear, they look like to show similar structures. Unfortunately, such a structure has problems described below and is not a preferred sputtering target for a magnetic recording medium. Note that the spherical substance shown in FIG. 4 of Patent Document 1 is not a structure constituting the target but a powder.

Even if an alloy powder produced by rapid solidification is not used, a magnetic material sputtering target also can be produced by weighing commercially available raw material powders as the components constituting a target so as to give a desired composition, mixing the powders by a known process with, for example, a ball mill, and molding and sintering the powder mixture by hot pressing.

For example, proposed is a method of preparing a sputtering target for a magnetic recording medium by mixing a Co spherical powder, and a powder mixture prepared by mixing a Co powder, a Cr powder, a $TiO_2$ powder and a $SiO_2$ powder using a planetary motion mixer, and molding the resulting powder mixture by hot pressing (Patent Document 2).

The target structure in this case appears such that spherical phases (B) are present in a metal base phase (A) containing inorganic grains uniformly dispersed therein (FIG. 1 of Patent Document 2).

Though such a structure is advantageous for improving the leakage magnetic flux, it is not a suitable sputtering target for a magnetic recording medium from the viewpoint of inhibiting occurrence of particles during sputtering.

Furthermore, proposed is a method of preparing a sputtering target for forming a thin film of magnetic recording medium by mixing a Co—Cr binary alloy powder, a Pt powder, and a $SiO_2$ powder and hot-pressing the resulting powder mixture (Patent Document 3).

It is described that the target structure in this case has a Pt phase, a $SiO_2$ phase, and a Co—Cr binary alloy phase and that a dispersion layer is observed in the periphery of the Co—Cr binary alloy layer (not shown in drawing). Such a structure is also not preferred for a sputtering target for a magnetic recording medium.

In addition to the above, there are some proposals for developing magnetic materials. For example, Patent Document 4 proposes a perpendicular magnetic recording medium including SiC and SiOx (x: 1 or 2). Patent Document 5 describes a magnetic material target containing Co, Pt, a first metal oxide, a second metal oxide, and a third metal oxide.

Patent Document 6 proposes a sputtering target composed of a Co and Pt matrix phase and a metal oxide phase having an average grain diameter of 0.05 μm or more and less than 7.0 μm and proposes to increase film-deposition efficiency by inhibiting the growth of crystal grains to obtain a target with a low magnetic permeability and a high density.

Patent Document 7 describes a non-magnetic grain dispersion-type ferromagnetic material sputtering target, in which the ferromagnetic material is composed of Co and Fe as main components and a material selected from oxides, nitrides, carbides, and silicides and the non-magnetic material has a specific shape (smaller than a virtual circle of a radius of 2 μm).

Patent Document 8 describes a non-magnetic grain dispersion-type ferromagnetic material sputtering target, in which non-magnetic grains of an oxide smaller than a virtual circle of a radius of 1 μm are dispersed in a ferromagnetic material of a Co—Cr alloy and the grain diameter thereof is minutely regulated. Patent Document 9 describes a magnetic film having a granular structure.

As described above, in non-magnetic grain dispersion-type ferromagnetic material sputtering targets, such as Co—Cr—Pt-oxide, use of $SiO_2$, $Cr_2O_3$, or $TiO_2$ as an oxide has been proposed. In addition, specification of the shape of an oxide has been proposed. However, these oxides are insulative materials and thereby cause abnormal discharge, which causes a problem of generating particles during sputtering.

The floating amount of a magnetic head is reduced year after year accompanied by an increase in the recording density of HDD. Accordingly, the acceptable size and number of particles on a magnetic recording medium have become increasingly restricted. It is known that many of the particles generated during the formation of a granular film are an oxide caused from a target. As a method for inhibiting such occurrence of particles, fine dispersion of an oxide in the target into an alloy matrix is believed to be effective.

In addition to Patent Documents 6 to 8, Patent Documents 10 to 15 also propose finer grains of metal oxides. That is, Patent Document 10 describes grains formed by a metal oxide phase having an average grain diameter of 0.05 µm or more and less than 7.0 µm; Patent Document 11 describes a ceramic phase having a long-axis grain diameter of 10 µm or less; Patent Document 12 describes an oxygen-containing material or an oxide phase of 50 µm or less; Patent Document 13 describes grains formed by an oxide phase having an average grain diameter of 3 µm or less; Patent Document 14 describes silica grains and titanium grains satisfying the requirement: 2≤Dp/Dn in a cross-section perpendicular to the main surface of a sputtering target, wherein Dn denotes the grain diameter in a direction perpendicular to the main surface of a sputtering target, and Dp denotes the grain diameter in a direction parallel to the main surface; and Patent Document 15 describes restriction of the number of chromium oxide aggregates to 500 grains/mm$^2$. Unfortunately, these conditions are still insufficient, and further improvement has been required yet.

Patent Document 1: JP H10-088333 A
Patent Document 2: Japanese Patent Application No. 2010-011326
Patent Document 3: JP 2009-001860 A
Patent Document 4: JP 2006-127621 A
Patent Document 5: JP 2007-004957 A
Patent Document 6: JP 2009-102707 A
Patent Document 7: Domestic Re-publication of International Publication No. WO2007/080781
Patent Document 8: International Publication No. WO2009/119812 A1
Patent Document 9: JP 2001-076329 A
Patent Document 10: International Publication No. WO2009-054369
Patent Document 11: JP 2006-045587 A
Patent Document 12: JP 2008-169464 A
Patent Document 13: JP 2009-215617 A
Patent Document 14: JP 2011-222086 A
Patent Document 15: JP 2008-240011 A

SUMMARY

In general, in a non-magnetic grain dispersion-type magnetic material sputtering target such as Co—Cr—Pt-oxide, the oxide such as $SiO_2$, $Cr_2O_3$, or $TiO_2$ contained therein is an insulative material and is therefore a cause of abnormal discharge, which causes a problem of generating particles during sputtering.

In view of the problems mentioned above, it is an object of the present invention to inhibit abnormal discharge caused by an oxide and to reduce occurrence of particles caused by abnormal discharge during sputtering. The frequency of abnormal discharge has been previously reduced by decreasing the grain size of an oxide. However, since the acceptable level of particles has become increasingly restricted with an increase in the recording density of magnetic recording media, it is an object of the present invention to provide a further improved non-magnetic grain dispersion-type magnetic material sputtering target.

In order to solve the above-mentioned problems, the present inventors have diligently studied and, as a result, have found that a target not causing abnormal discharge due to an oxide during sputtering and generating less particles can be obtained by adjusting the composition (oxide grains) structure of the target.

Based on these findings, the present invention provides:
1) A magnetic material sputtering target comprising a metal phase containing Co or Fe and oxide grains dispersed in the metal phase, wherein, in a plane for observing the oxide in the target, the oxide grains in the target have an average diameter of 1.5 µm or less; and 60% or more of the oxide grains in the observing plane of the target have a difference between a maximum diameter and a minimum diameter of 0.4 µm or less, where the maximum diameter is a maximum distance between arbitrary two points on the periphery of an oxide grain, and the minimum diameter is a minimum distance between two parallel lines across the oxide grain;
2) The magnetic material sputtering target according to 1), wherein metal grains are present in the target in which the oxide grains are dispersed in the metal phase, and one or more of the metal grains in a visual field of 1 mm$^2$ has a sum of a maximum diameter and a minimum diameter of 30 µm or more, where the maximum diameter is a maximum distance between arbitrary two points on the periphery of a metal grain, and the minimum diameter is a minimum distance between two parallel lines across the metal grain; 3) The magnetic material sputtering target according to 1) or 2), wherein the oxide grains present in the target have a maximum diameter of 9 µm or less; 4) The magnetic material sputtering target according to any one of 1) to 3), wherein the oxide is one or more oxides selected from $SiO_2$, $TiO_2$, $Ti_2O_3$, $Cr_2O_3$, $Ta_2O_5$, $Ti_5O_9$, $B_2O_3$, CoO, and $Co_3O_4$; and the target contains the oxide in an amount of 0.5 to 25 mol %.
5) The magnetic material sputtering target according to any one of 1) to 4), wherein the metal phase is composed of 0 mol % or more and 20 mol % or less of Cr, 5 mol % or more and 30 mol % or less of Pt, and the remainder being Co and inevitable impurities;
6) The magnetic sputtering target according to any one of 1) to 4), wherein the metal phase is composed of exceeding 0 mol % and 60 mol % or less of Pt and the remainder being Fe and inevitable impurities;
7) The magnetic material sputtering target according to any one of 1) to 6), wherein the metal phase further contains one or more elements selected from Mg, Al, Si, Mn, Nb, Mo, Ru, Pd, Ta, W, B, and Cu in an amount of 0.5 to 12 mol %, and the remainder is Co or Fe and inevitable impurities; and
8) The magnetic material sputtering target according to any one of 1) to 7), the target having a relative density of 97% or more.

The thus-prepared non-magnetic grain dispersion-type magnetic material sputtering target of the present invention does not cause abnormal discharge due to an oxide during sputtering and generates less particles. The invention consequently has an excellent effect of increasing the yield to improve the cost effectiveness.

DETAILED DESCRIPTION

Figure 1:
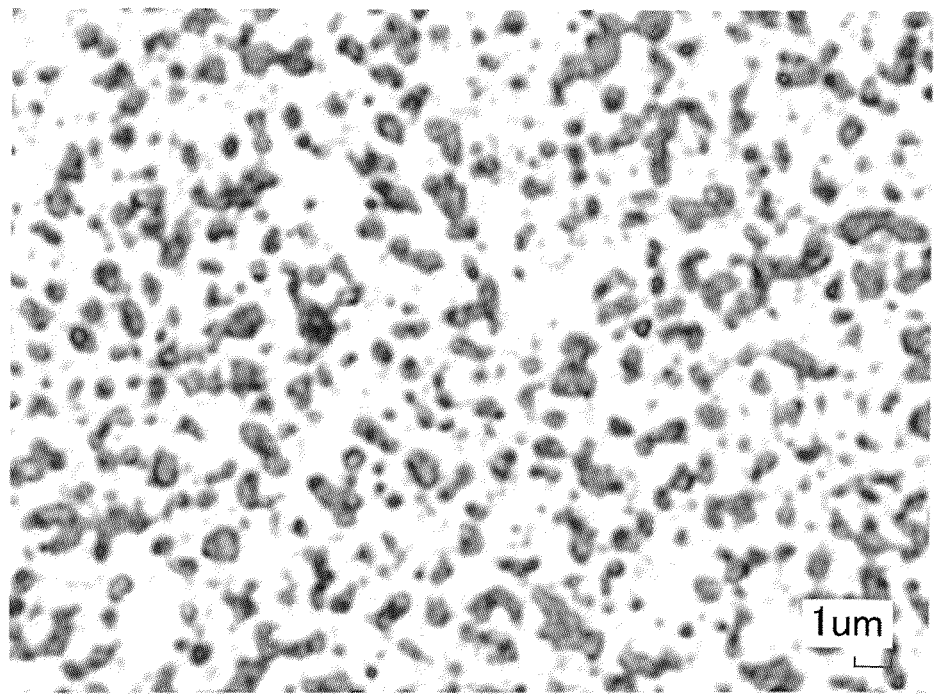
FIG. 1 This is a diagram (photograph) showing the Co—Pt—Cr—$SiO_2$—$TiO_2$—$Cr_2O_3$ target composition of Example 1.

In the magnetic material sputtering target of the present invention, oxide grains contained therein have an average diameter of 1.5 μm or less. If the oxide grains have an average diameter of larger than 1.5 μm, occurrence of particles is disadvantageously increased. Such a technology is conventionally known. However, the present invention is based on, in having shapes similar to spheres are an effective measure for preventing occurrence of particles.

An improvement in magnetic characteristics needs a certain amount of an oxide. If the oxide has atypical appearance, as shown in Comparative Examples below, a difference in the distribution of the oxide is caused between an oxide-containing region and an oxide-free region in a certain area of a target surface, resulting in easy occurrence of segregation. Spherical or sphere-like oxide grains cause less segregation because of the uniform grain shapes, and can effectively inhibit occurrence of particles.

Furthermore, it is desirable that most of the oxide grains in a plane for observing the oxide in the target are such spherical or sphere-like oxide grains. That is, 60% or more, preferably 90% or more, and most preferably 100% of the oxide grains are spherical or sphere-like oxide grains. Consequently, a magnetic material sputtering target that can significantly inhibit occurrence of particles can be obtained.

It is also effective that the magnetic material sputtering target of the present invention further contains metal coarse grains (metal grains) in the metal phase in which the oxide grains are dispersed. Such a target composition can improve the leakage magnetic flux of the magnetic material target. Consequently, even if the target has a large thickness, stable discharge is obtained, resulting in satisfactory sputtering.

The magnetic material sputtering target of the present invention is particularly effective for, for example, a Co alloy system, a Co—Cr—Pt alloy system, and a Fe—Pt alloy system, in particular for a Co alloy system. The present invention can be applied to known magnetic materials, and the blending ratio of components necessary as a magnetic recording medium can be variously changed depending on the purpose.

As the Co alloy system, a ferromagnetic sputtering target composed of 0 mol % or more and 20 mol % or less of Cr, 5 mol % or more and 30 mol % or less of Pt, and the remainder being Co and inevitable impurities can be produced.

As the Fe—Pt alloy system, a ferromagnetic material sputtering target composed of exceeding 0 mol % and 60 mol % or less of Pt and the remainder being Fe and inevitable impurities can be produced.

The amount of each element shows a suitable numerical range for utilizing the characteristics of a ferromagnetic material, and it should be understood that an amount outside the range can be applied as necessary. Such ranges are all encompassed in the present invention.

The oxide added in the ferromagnetic material is one or more oxides selected from SiO$_2$, TiO$_2$, Ti$_2$O$_3$, Cr$_2$O$_3$, Ta$_2$O$_5$, Ti$_5$O$_9$, B$_2$O$_3$, CoO, and Co$_3$O$_4$. The target usually contains the oxide in an amount of 0.5 to 25 mol %.

These oxides can be arbitrarily selected and added depending on the type of a required ferromagnetic film. The added amount is an effective amount to exert an effect of the addition.

Even if the oxide satisfies the requirement that the average grain diameter is 1.5 μm or less, the maximum grain diameter preferably does not exceed 9 μm and more preferably does not exceed 7 μm. Since the acceptable level of grains has become increasingly restricted with an increase in the recording density of magnetic recording media, oxide grains having a diameter of exceeding 9 μm are unsuitable as the oxide contained in the ferromagnetic material.

The oxide grains having an average diameter of 1.5 μm or less and a maximum diameter of not exceeding 9 μm are suitable for providing a further improved non-magnetic grain dispersion-type magnetic material sputtering target.

The magnetic material sputtering target of the present invention can further contain one or more elements selected from Mg, Al, Si, Mn, Nb, Mo, Ru, Pd, Ta, W, B, and Cu in an amount of 0.5 to 12 mol %. These elements are added as necessary for improving the characteristics of a magnetic recording medium. The added amount is an effective amount to exert an effect of the addition.

The magnetic material sputtering target of the present invention desirably has a relative density of 97% or more. It is generally known that a target having a higher density can reduce the amount of particles occurring during sputtering. Similarly, also in the present invention, a higher density is preferred. In the present invention, a relative density of 97% or more can be achieved.

In the present invention, the relative density is a value determined by dividing the measured density of a target by the calculated density (also referred to as theoretical density). The calculated density is a density obtained by assuming that the constituent components of a target are mixed without diffusing to or reacting with one another and is calculated by the following expression:

> Expression: calculated density=Σ[(molecular weight of a constituent component)×(mole ratio of the constituent component]/Σ[(molecular weight of the constituent component)×(mole ratio of the constituent component)/(literature density of the constituent component)], wherein, Σ means the sum of the values of all constituent components of the target.

The magnetic material sputtering target of the present invention can be produced by a powder metallurgy method. In the powder metallurgy method, first, powders of the respective metal elements and, as necessary, a powder of additive metal element are prepared.

These powders desirably each have a maximum grain diameter of 20 μm or less. Instead of the powders of each metal element, an alloy powder of these metals may be prepared. In also such a case, the maximum grain diameter is desirably 20 μm or less. However, a too small grain diameter accelerates oxidation to cause problems such that the component composition falls outside the intended range. Accordingly, the diameter is also desirably 0.1 μm or more. In addition, as shown in Example 3 described below, coarse grains of a diameter of 50 to 300 μm are preferably used as the metal grains contained in the target.

Subsequently, these metal powders and alloy powders are weighed to give a desirable composition and are mixed and pulverized with a known procedure using, for example, a ball mill. When an oxide powder other than $SiO_2$ is added, the powder may be mixed with the metal powders and alloy powders on this stage.

The oxide powder other than $SiO_2$ desirably has a maximum grain diameter of 5 μm or less. Since a too small grain diameter tends to aggregate, the diameter is also desirably 0.1 μm or more. The mixer is preferably a planetary motion mixer or a planetary motion agitator. In addition, considering the problem of oxidation during mixing, the mixing is preferably performed in an inert gas atmosphere or in vacuum.

As described above, in the present invention, it is particularly important that, in a plane for observing the oxide in the target, when a maximum distance between arbitrary two points on the periphery of an oxide grain is defined as a maximum diameter and a minimum distance between two parallel lines between which the oxide grain is sandwiched (across the oxide grain) is defined as a minimum diameter, the difference between the maximum diameter and the minimum diameter is 0.4 μm or less.

Calculation of the maximum diameter and the minimum diameter is performed with image processing analytic software using a microscopic image displayed on a PC. As the image processing analysis software, shape analysis software (VK-Analyzer VK-H1A1) manufactured by Keyence Corporation was used.

A sintered compact of a magnetic material in which spherical or sphere-like oxide grains are dispersed can be constantly obtained, although it also depends on the component composition of the magnetic material, by finding the conditions allowing the oxide grains to have spherical shapes through selection of the raw materials, and setting of mixing conditions and sintering conditions, and by fixing the manufacturing conditions.

Furthermore, it is desirable that most of the oxide grains in a plane for observing the oxide in the target are such spherical or sphere-like oxide grains. That is, 60% or more, preferably 90% or more, and most preferably 100% of the oxide grains are spherical or sphere-like oxide grains. Consequently, a magnetic material sputtering target that can significantly inhibit occurrence of particles can be obtained.

EXAMPLES

The present invention will now be described by Examples and Comparative Examples. The Examples are merely exemplary and are not intended to limit the scope of the invention. That is, the present invention is limited only by the claims and encompasses various modifications in addition to these Examples.

Example 1

As metal raw material powders, a Co powder having an average grain diameter of 4 μm, a Cr powder having an average grain diameter of 5 μm, and a Pt powder having an average grain diameter of 3 μm, and as oxide powders, a $TiO_2$ powder having an average grain diameter of 1.2 μm, a spherical $SiO_2$ powder having an average grain diameter of 0.7 μm, and a $Cr_2O_3$ powder having an average grain diameter of 1 μm were prepared. These powders were weighed at the following composition ratio in the total amount of 2000 g. The composition was as follows:

Composition: $60Co-25Pt-3Cr-5SiO_2-2TiO_2-5Cr_2O_3$ (mol %)

Subsequently, the weighed powders were put and sealed in a 10-L ball mill pot together with tungsten alloy balls as a grinding medium and were mixed by rotating the ball mill for 120 hours. The powder mixture was loaded in a carbon mold and was hot-pressed in a vacuum atmosphere under conditions of a temperature of 1100° C., a retention time of 2 hours, and a pressure of 30 MPa to obtain a sintered compact. The sintered compact was machined with a lathe to obtain a disk-shaped target having a diameter of 180 mm and a thickness of 5 mm.

The target surface was polished to observe the structure with a microscope. When a maximum distance between arbitrary two points on the periphery of an oxide grain is defined as a maximum diameter and a minimum distance between two parallel lines across the oxide grain is defined as a minimum diameter, 71% of the oxide grains in the visual field of the microscope had a difference between the maximum diameter and the minimum diameter of 0.4 μm or less. The average grain diameter was 0.71 μm, and the maximum grain diameter was 5.2 μm.

The resulting appearance is shown in FIG. 1. The maximum diameter, the minimum diameter, and the average grain diameter were calculated with image processing using a microscopic image displayed on a PC. The same applies hereinafter.

Subsequently, the target was attached to a DC magnetron sputtering apparatus and was used for sputtering. Under sputtering conditions of a sputtering power of 1.2 kW and an Ar gas pressure of 1.5 Pa, after presputtering at 2 kWhr, sputtering was performed onto a 4-inch silicon substrate at a predictive film thickness of 1000 nm.

Then, the number of particles adhered onto the substrate was measured with a particle counter. On this occasion, the number of particles on the silicon substrate was 4.

Even if a silicon substrate is not subjected to sputtering, a particle counter may count 0 (zero) to 5 particles on the silicon substrate. Therefore, the 4 particles in this Example is a significantly low level.

Comparative Example 1

As metal raw material powders, a Co powder having an average grain diameter of 4 μm, a Cr powder having an average grain diameter of 5 μm, and a Pt powder having an average grain diameter of 3 μm, and as oxide powders, a $TiO_2$ powder having an average grain diameter of 1.2 μm, an acicular $SiO_2$ powder having an average grain diameter of 0.7 μm, and a $Cr_2O_3$ powder having an average grain diameter of 1 μm were prepared. These powders were weighed at the following composition ratio in the total amount of 2000 g. The composition was as follows:

Composition: $60Co-25Pt-3Cr-5SiO_2-2TiO_2-5Cr_2O_3$ (mol %)

Subsequently, the weighed powders were put and sealed in a 10-L ball mill pot together with tungsten alloy balls as a grinding medium and were mixed by rotating the ball mill for 100 hours. The powder mixture was loaded in a carbon mold and was hot-pressed in a vacuum atmosphere under conditions of a temperature of 1100° C., a retention time of 2 hours, and a pressure of 30 MPa to obtain a sintered compact. The sintered compact was machined with a lathe to obtain a disk-shaped target having a diameter of 180 mm and a thickness of 5 mm.

Figure 2:
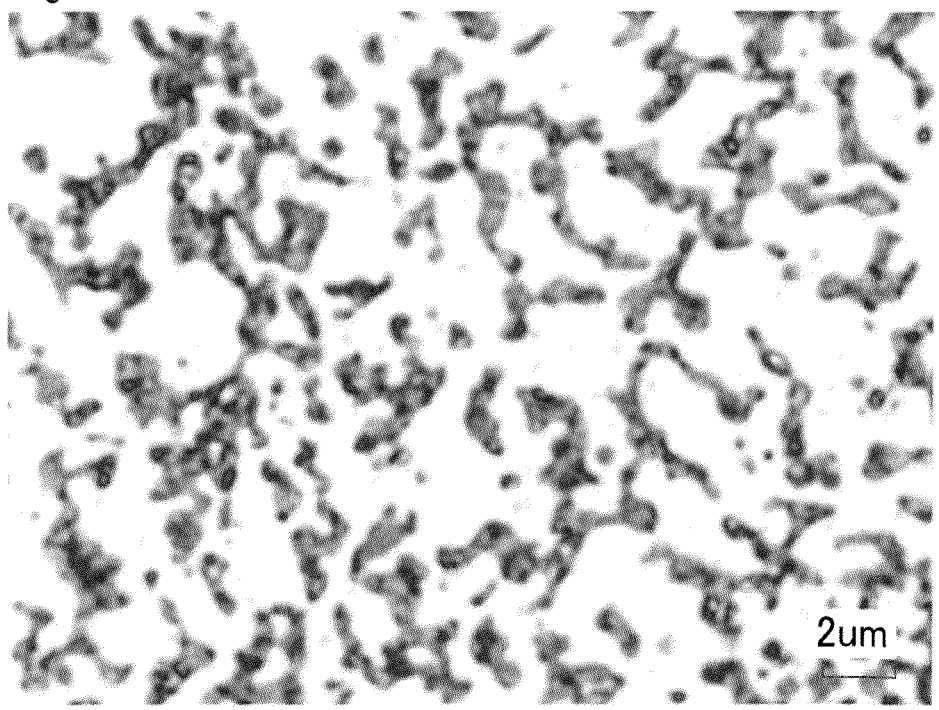
FIG. 2 This is a diagram (photograph) showing the Co—Pt—Cr—SiO$_2$—TiO$_2$—Cr$_2$O$_3$ target composition of Comparative Example 1.

The structure of the target was observed. The average diameter of the oxide grains in the visual field of a microscope was 1.26 μm; the ratio of oxide grains having a difference between the maximum diameter and the minimum diameter of 0.4 μm or less evaluated as in Example 1 was 56%; and the maximum diameter was 8 μm. The resulting appearance is shown in FIG. 2.

Subsequently, the target was attached to a DC magnetron sputtering apparatus and was used for sputtering. Under sputtering conditions of a sputtering power of 1.2 kW and an Ar gas pressure of 1.5 Pa, after presputtering at 2 kWhr, sputtering was performed onto a 4-inch silicon substrate at a predictive film thickness of 1000 nm. Then, the number of particles adhered onto the substrate was measured with a particle counter. On this occasion, the number of particles on the silicon substrate was increased to 15.

Example 2

As metal raw material powders, a Co powder having an average grain diameter of 4 μm, a Cr powder having an average grain diameter of 5 μm, a Pt powder having an average grain diameter of 3 μm, and a Ru powder having an average grain diameter of 5 μm, and as oxide powders, a spherical $TiO_2$ powder having an average grain diameter of 2 μm, a spherical $SiO_2$ powder having an average grain diameter of 0.7 μm, and a spherical CoO powder having an average grain diameter of 1 μm were prepared. These powders were weighed at the following composition ratio in the total amount of 2000 g. The composition was as follows:

Composition: 55Co-20Pt-5Ru-3Cr-5$SiO_2$-2$TiO_2$-10CoO (mol %)

Subsequently, the weighed powders were put and sealed in a 10-L ball mill pot together with zirconia balls as a grinding medium and were mixed by rotating the ball mill for 120 hours. The powder mixture was loaded in a carbon mold and was hot-pressed in a vacuum atmosphere under conditions of a temperature of 1000° C., a retention time of 2 hours, and a pressure of 30 MPa to obtain a sintered compact. The sintered compact was machined with a lathe to obtain a disk-shaped target having a diameter of 180 mm and a thickness of 5 mm.

Figure 3:
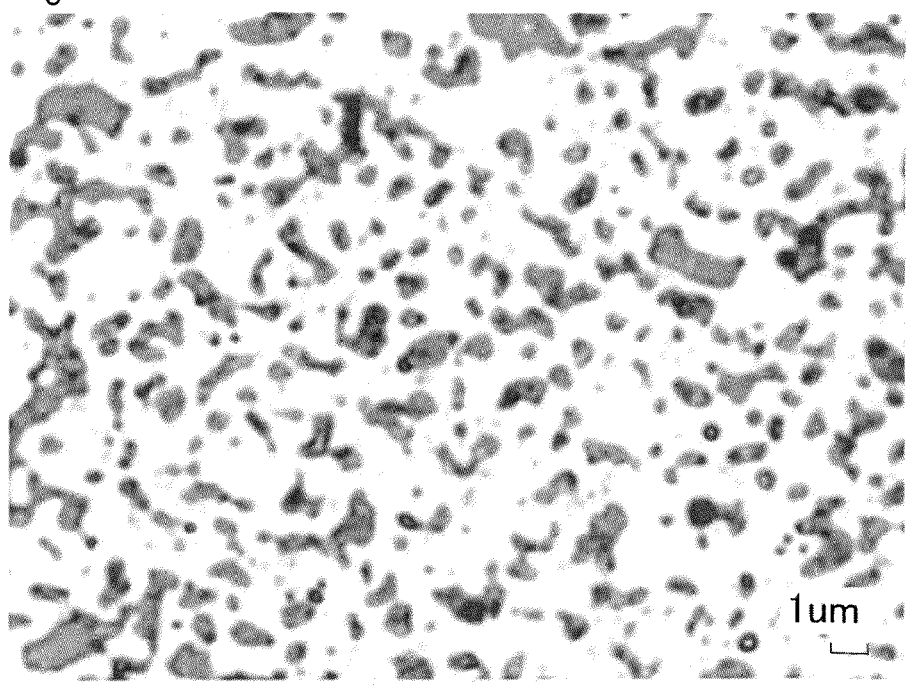
FIG. 3 This is a diagram (photograph) showing the Co—Pt—Ru—Cr—SiO$_2$—TiO$_2$—CoO target composition of Example 2.
Figure 4:
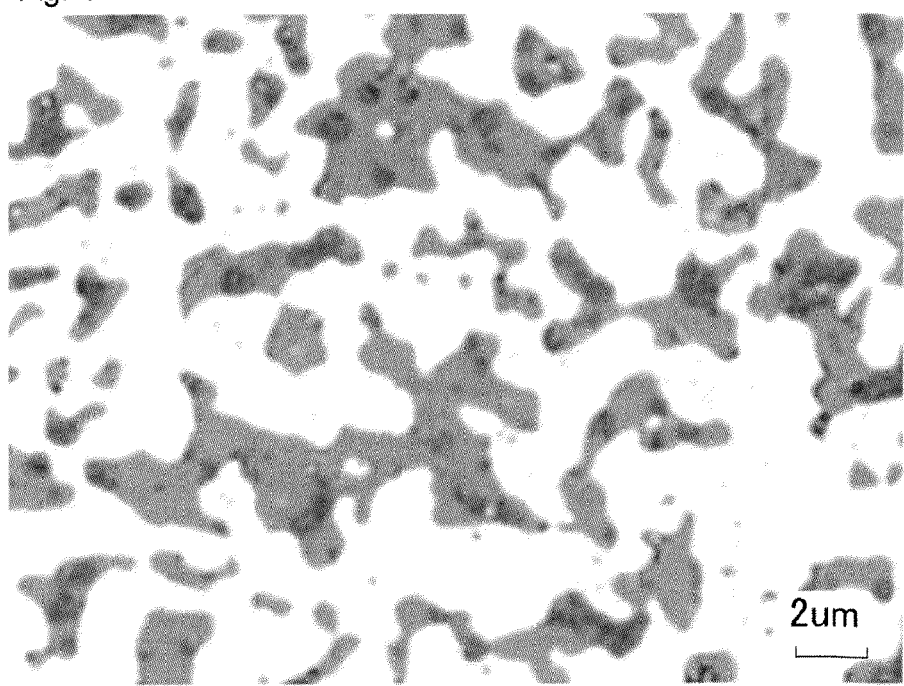
FIG. 4 This is a diagram (photograph) showing the Co—Pt—Ru—Cr—SiO$_2$—TiO$_2$—CoO target composition of Comparative Example 2.
Figure 5:
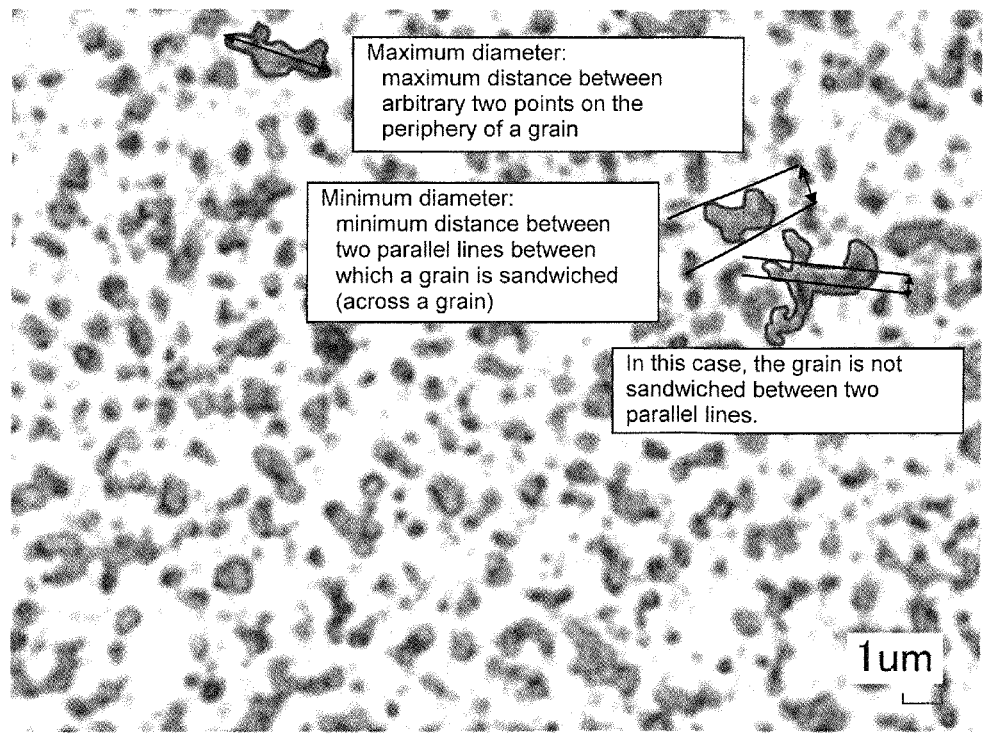
FIG. 5 This is a diagram explaining a method of measuring the maximum diameter and the minimum diameter of an oxide grain.

The structure of the target was observed. The average diameter of the oxide grains in the visual field of a microscope was 0.84 μm; the ratio of oxide grains having a difference between the maximum diameter and the minimum diameter of 0.4 μm or less evaluated as in Example 1 was 63%; and the maximum grain diameter was 6.4 μm. The resulting appearance is shown in FIG. 3.

Subsequently, the target was attached to a DC magnetron sputtering apparatus and was used for sputtering. Under sputtering conditions of a sputtering power of 1.2 kW and an Ar gas pressure of 1.5 Pa, after presputtering at 2 kWhr, sputtering was performed onto a 4-inch silicon substrate at a predictive film thickness of 1000 nm. Then, the number of particles adhered onto the substrate was measured with a particle counter. On this occasion, the number of particles on the silicon substrate was 5.

Comparative Example 2

As metal raw material powders, a Co powder having an average grain diameter of 4 μm, a Cr powder having an average grain diameter of 5 μm, a Pt powder having an average grain diameter of 3 μm, and a Ru powder having an average grain diameter of 10 μm, and as oxide powders, a $TiO_2$ powder having an average grain diameter of 1.2 μm, an acicular $SiO_2$ powder having an average grain diameter of 0.7 μm, and a spherical CoO powder having an average grain diameter of 1 μm were prepared. These powders were weighed at the following composition ratio in the total amount of 2000 g. The composition was as follows:

Composition: 55Co-20Pt-5Ru-3Cr-5$SiO_2$-2$TiO_2$-10CoO (mol %)

Subsequently, the weighed powders were put and sealed in a 10-L ball mill pot together with zirconia balls as a grinding medium and were mixed by rotating the ball mill for 100 hours. The powder mixture was loaded in a carbon mold and was hot-pressed in a vacuum atmosphere under conditions of a temperature of 1100° C., a retention time of 2 hours, and a pressure of 30 MPa to obtain a sintered compact. The sintered compact was machined with a lathe to obtain a disk-shaped target having a diameter of 180 mm and a thickness of 5 mm.

The structure of the target was observed. The average diameter of the oxide grains in the visual field of a microscope was 1.58 μm; the ratio of oxide grains having a difference between the maximum diameter and the minimum diameter of 0.4 μm or less evaluated as in Example 1 was 46%; and the maximum grain diameter was 12 μm.

Subsequently, the target was attached to a DC magnetron sputtering apparatus and was used for sputtering. Under sputtering conditions of a sputtering power of 1.2 kW and an Ar gas pressure of 1.5 Pa, after presputtering at 2 kWhr, sputtering was performed onto a 4-inch silicon substrate at a predictive film thickness of 1000 nm. Then, the number of particles adhered onto the substrate was measured with a particle counter. On this occasion, the number of particles on the silicon substrate was 23.

Example 3

As metal raw material powders, a Co powder having an average grain diameter of 4 μm, a Pt powder having an average grain diameter of 3 μm, a Ru powder having an average grain diameter of 5 μm, a Cr powder having an average grain diameter of 5 μm, and a Ta powder having an average grain diameter of 5 μm, and as oxide powders, a spherical $SiO_2$ powder having an average grain diameter of 0.7 μm, a $B_2O_3$ powder having an average grain diameter of 2 μm, and a $Co_3O_4$ powder having an average grain diameter of 1 μm were prepared. Furthermore, a Co coarse powder of which the grain diameter was controlled within a range of 50 to 300 μm was prepared, and the weight ratio of the Co powder having an average grain diameter of 4 μm to the Co coarse powder was adjusted to 7:3. These powders were weighed at the following composition ratio in the total amount of 2000 g. The composition was as follows:

Composition: 67.2Co-18Pt-2Cr-3Ru-0.8Ta-6$SiO_2$-1$B_2O_3$-2$Co_3O_4$ (mol %)

Figure 6:
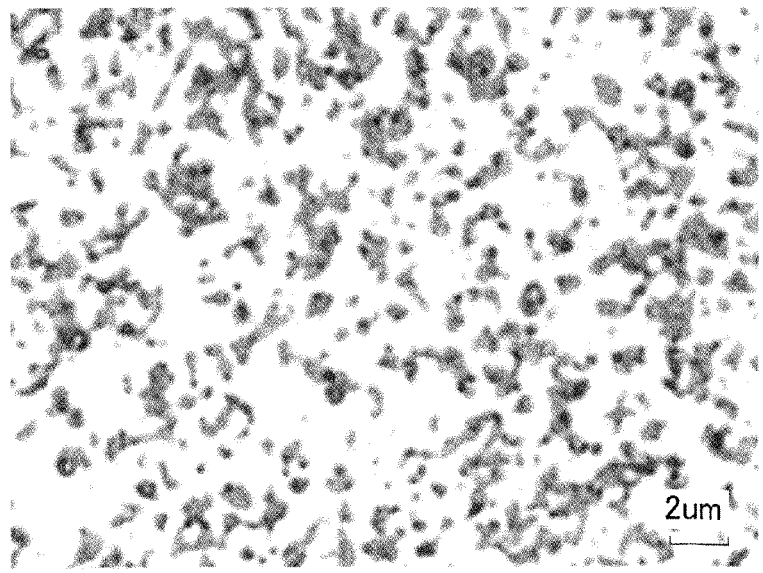
FIG. 6 This is a diagram (photograph) showing the Co—Pt—Cr—Ru—Ta—SiO$_2$—B$_2$O$_3$—CoO target composition of Example 3.
Figure 7:
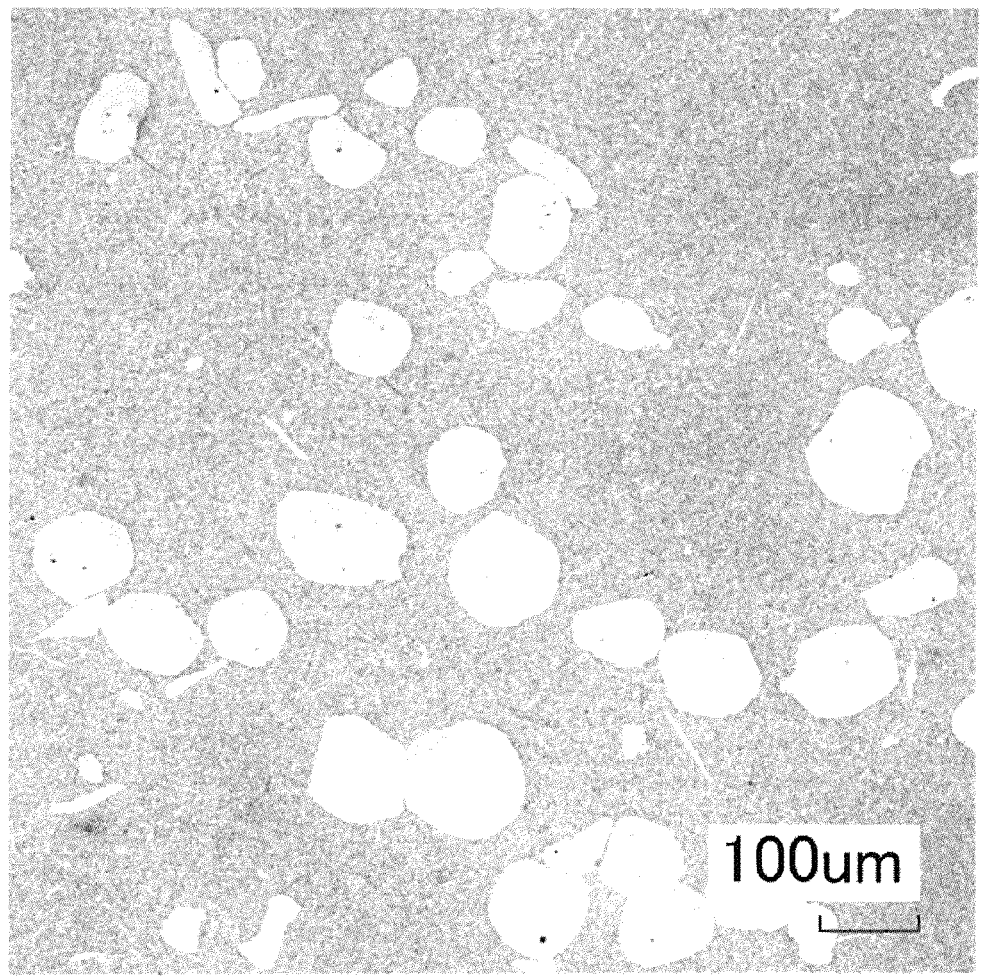
FIG. 7 This is a diagram (photograph: low magnification) showing the target composition of Example 3.

Subsequently, the weighed powders excluding the Co coarse powder were put and sealed in a 10-L ball mill pot together with zirconia balls as a grinding medium and were mixed by rotating the ball mill for 120 hours. Then, the Co coarse powder was added into the ball mill pot, and mixing was performed for 1 hour. The powder mixture was loaded in a carbon mold and was hotpressed in a vacuum atmosphere under conditions of a temperature of 900° C., a retention time of 2 hours, and a pressure of 30 MPa to obtain a sintered compact. The sintered compact was machined with a lathe to obtain a diskshaped target having a diameter of 180 mm and a thickness of 7 mm. The structure of the target was observed. The average diameter of the oxide grains in the visual field of a microscope was 1.16 µm; the ratio of oxide grains having a difference between the maximum diameter and the minimum diameter of 0.4 µm or less evaluated as in Example 1 was 61%; and the maximum grain diameter was 6.4 µm. The resulting appearance is shown in FIG. 6. The target surface was polished to observe the structure with a microscope. As shown in FIG. 7, it was revealed that metal grains were scattered in the structure in which non-magnetic grains were dispersed in a metal phase. When a maximum distance between arbitrary two points on the periphery of an oxide grain is defined as a maximum diameter and a minimum distance between two parallel lines across the oxide grain is defined as a minimum diameter, the number of metal grains having a sum of the maximum diameter and the minimum diameter of 30 µm or more in a visual field of 1 mm$^2$ was 42. The leakage magnetic flux of the target was improved compared to the case of not containing metal grains.

Subsequently, the target was attached to a DC magnetron sputtering apparatus and was used for sputtering. Under sputtering conditions of a sputtering power of 1.2 kW and an Ar gas pressure of 1.5 Pa, after presputtering at 2 kWhr, sputtering was performed onto a 4-inch silicon substrate at a predictive film thickness of 1000 nm. Then, the number of particles adhered onto the substrate was measured with a particle counter. On this occasion, the number of particles on the silicon substrate was 5.

Example 4

As metal raw material powders, a Fe powder having an average grain diameter of 4 µm and a Pt powder having an average grain diameter of 3 µm, and as oxide powders, a TiO$_2$ powder having an average grain diameter of 1.2 µm, a spherical SiO$_2$ powder having an average grain diameter of 0.7 µm, a CoO powder having an average grain diameter of 0.8 µm, and a B$_2$O$_3$ powder having an average grain diameter of 5 µm were prepared. These powders were weighed at the following composition ratio in the total amount of 2000 g.

Composition: 86(80Fe-20Pt)-10SiO$_2$-2TiO$_2$-1CoO-1B$_2$O$_3$ (mol %)

Subsequently, the weighed powders were put and sealed in a 10-L ball mill pot together with tungsten alloy balls as a grinding medium and were mixed by rotating the ball mill for 120 hours. The thus-prepared powder mixture was loaded in a carbon mold and was hot-pressed in a vacuum atmosphere under conditions of a temperature of 1000° C., a retention time of 2 hours, and a pressure of 30 MPa to obtain a sintered compact. The sintered compact was machined with a lathe to obtain a disk-shaped target having a diameter of 180 mm and a thickness of 5 mm.

The ratio of non-magnetic grains having a difference between the maximum diameter and the minimum diameter of 0.4 µm or less evaluated as in Example 1 was 63%; the average grain diameter was 1.49 µm; and maximum grain diameter was 6.1 µm.

Subsequently, the target was attached to a DC magnetron sputtering apparatus and was used for sputtering. Under sputtering conditions as in Example 1 of a sputtering power of 1.2 kW and an Ar gas pressure of 1.5 Pa, after presputtering at 2 kWhr, sputtering was performed onto a 4-inch silicon substrate at a predictive film thickness of 1000 nm. Then, the number of particles adhered onto the substrate was measured with a particle counter. On this occasion, the number of particles on the silicon substrate was 4.

TABLE 1

| | Target composition ratio (atomic ratio) | Average diameter of non-magnetic grains in sintered compact (µm) | Ratio of non-magnetic grains having a difference between maximum diameter and minimum diameter of 0.4 µm or less (%) | Number of metal grains having a sum of maximum diameter and minimum diameter of 30 µm or more | Number of particles |
|---|---|---|---|---|---|
| Example 1 | 60Co—25Pt—3Cr—5SiO$_2$—2TiO$_2$—5Cr$_2$O$_3$ | 0.71 | 71 | — | 4 |
| Example 2 | 55Co—20Pt—5Ru—3Cr—5SiO$_2$—2TiO$_2$—10CoO | 0.84 | 63 | — | 5 |
| Example 3 | 67.2Co—18Pt—2Cr—3Ru—0.8Ta—6SiO$_2$—1B$_2$O$_3$—2Co$_3$O$_4$ | 1.16 | 61 | 42 | 5 |
| Example 4 | 86(80Fe—20Pt)—10SiO$_2$—2TiO$_2$—1CoO—1B$_2$O$_3$ | 1.49 | 63 | — | 4 |
| Comparative Example 1 | 60Co—25Pt—3Cr—5SiO$_2$—2TiO$_2$—5Cr$_2$O$_3$ | 1.26 | 56 | — | 15 |
| Comparative Example 2 | 55Co—20Pt—5Ru—3Cr—5SiO$_2$—2TiO$_2$—10CoO | 1.58 | 46 | — | 23 |

The present invention does not cause abnormal discharge due to an oxide during sputtering and can reduce occurrence of particles by adjusting the composition structure of a magnetic material sputtering target, in particular, the shape of oxide grains. Accordingly, the target of the present invention can provide stable discharge during sputtering with a magnetron sputtering apparatus. Furthermore, the target has an excellent effect of preventing abnormal discharge due to an oxide, reducing the occurrence of particles caused by abnormal discharge during sputtering, and being capable of increasing the yield to improve the cost effectiveness. Accordingly, the target is useful as a magnetic material sputtering target that is used in formation of a magnetic thin film for a magnetic recording medium, in particular, a film for a hard disk drive recording layer.

The invention claimed is:

1. A magnetic material sputtering target comprising a metal phase containing Co or Fe, and oxide grains dispersed among the metal phase, wherein, in a plane for observing the oxide in the target, the oxide grains in the target have an average diameter of 1.5 µm or less; and 60% or more of the oxide grains in the observing plane of the target have a difference between a maximum diameter and a minimum diameter of 0.4 µm or less, where the maximum diameter is a maximum distance between arbitrary two points on the periphery of an oxide grain, and the minimum diameter is a minimum distance between two parallel lines across the oxide grain.

2. The magnetic material sputtering target according to claim 1, wherein metal grains are present in the target among which the oxide grains are dispersed in the metal phase, and one or more of the metal grains in a visual field of 1 mm$^2$ has a sum of a maximum diameter and a minimum diameter of 30 µm or more, where the maximum diameter is a maximum distance between arbitrary two points on the periphery of a metal grain, and the minimum diameter is a minimum distance between two parallel lines across the metal grain.

3. The magnetic material sputtering target according to claim 2, wherein the oxide grains present in the target have a maximum diameter of 9 µm or less.

4. The magnetic material sputtering target according to claim 3, wherein the oxide is one or more oxides selected from $SiO_2$, $TiO_2$, $Ti_2O_3$, $Cr_2O_3$, $Ta_2O_5$, $Ti_5O_9$, $B_2O_3$, $CoO$, and $CO_3O_4$; and the target contains the oxide in an amount of 0.5 to 25 mol %.

5. The magnetic material sputtering target according to claim 4, wherein the metal phase is composed of 0 mol % or more and 20 mol % or less of Cr, 5 mol % or more and 30 mol % or less of Pt, and the remainder being Co and inevitable impurities.

6. The sputtering target according to claim 4, wherein the metal phase is composed of exceeding 0 mol % and 60 mol % or less of Pt and the remainder being Fe and inevitable impurities.

7. The magnetic material sputtering target according to claim 4, wherein the metal phase contains one or more elements selected from Mg, Al, Si, Mn, Nb, Mo, Ru, Pd, Ta, W, B, and Cu in an amount of 0.5 to 12 mol %, and the remainder is Co or Fe and inevitable impurities.

8. The magnetic material sputtering target according to claim 4, wherein the target has a relative density of 97% or more.

9. The magnetic material sputtering target according to claim 1, wherein the oxide grains present in the target have a maximum diameter of 9 µm or less.

10. The magnetic material sputtering target according to claim 1, wherein the oxide is one or more oxides selected from $SiO_2$, $TiO_2$, $Ti_2O_3$, $Cr_2O_3$, $Ta_2O_5$, $Ti_5O_9$, $B_2O_3$, $CoO$, and $Co_3O_4$; and the target contains the oxide in an amount of 0.5 to 25 mol %.

11. The magnetic material sputtering target according to claim 1, wherein the metal phase is composed of 0 mol % or more and 20 mol % or less of Cr, 5 mol % or more and 30 mol % or less of Pt, and the remainder being Co and inevitable impurities.

12. The sputtering target according to claim 1, wherein the metal phase is composed of exceeding 0 mol % and 60 mol % or less of Pt and the remainder being Fe and inevitable impurities.

13. The magnetic material sputtering target according to claim 1, wherein the metal phase contains one or more elements selected from Mg, Al, Si, Mn, Nb, Mo, Ru, Pd, Ta, W, B, and Cu in an amount of 0.5 to 12 mol %, and the remainder is Co or Fe and inevitable impurities.

14. The magnetic material sputtering target according to claim 1, wherein the target has a relative density of 97% or more.

* * * * *